(12) United States Patent
Farnsworth

(10) Patent No.: US 7,168,024 B2
(45) Date of Patent: Jan. 23, 2007

(54) DATA PROCESSING SYSTEM AND METHOD

(75) Inventor: Timothy Luke Farnsworth, Sheffield (GB)

(73) Assignee: Jennic Limited, Sheffield (GB)

( * ) Notice: Subject to any disclaimer, the term of this patent is extended or adjusted under 35 U.S.C. 154(b) by 497 days.

(21) Appl. No.: 10/678,625

(22) Filed: Oct. 3, 2003

(65) Prior Publication Data

US 2005/0086571 A1    Apr. 21, 2005

(51) Int. Cl.
*H03M 13/00*    (2006.01)
(52) U.S. Cl. .................. 714/758; 714/800; 714/801
(58) Field of Classification Search ................ 714/758, 714/800, 801
See application file for complete search history.

(56) References Cited

U.S. PATENT DOCUMENTS

| | | | | |
|---|---|---|---|---|
| 4,138,676 A | * | 2/1979 | Becker et al. ................. | 342/44 |
| 5,428,629 A | * | 6/1995 | Gutman et al. ............. | 714/758 |
| 5,719,884 A | * | 2/1998 | Roth et al. .................. | 714/755 |
| 6,721,919 B1 | * | 4/2004 | Morioka et al. ............ | 714/801 |
| 7,020,123 B1 | * | 3/2006 | Park et al. .................. | 370/342 |
| 7,028,248 B1 | * | 4/2006 | Chen et al. ................. | 714/785 |

OTHER PUBLICATIONS

Choi et al. A fault-tolerant systolic sorter, IEEE Transactions on Computers, vol. 37, Issue 5, May 1988 pp. 621-624.*
Lettieri et al. Data compression in the V.42bis modems, WESCON/94. 'Idea/Microelectronics'. Conference Record Sep. 27-29, 1994 pp. 398-403.*
Gorshe CRC-16 polynomials optimized for applications using self-synchronous scramblers, ICC 2002. IEEE International Conference on Communications vol. 5, Apr. 28-May 2, 2002 pp. 2791-2795 vol. 5.*

* cited by examiner

*Primary Examiner*—Guy J. Lamarre
(74) *Attorney, Agent, or Firm*—Myers Bigel Sibley & Sajovec, PA

(57) ABSTRACT

A method for generating at least one error checking code includes creating a modified input data word, including (k+m) bits, by combining an input data word, having n-bits, with at least a previously calculated at least one error checking code, including in-bits, where n≦k, and calculating a first m-bit error checking code from at least a first selected portion of the modified input data word.

42 Claims, 8 Drawing Sheets

DATA PROCESSING SYSTEM AND METHOD

FIELD OF THE INVENTION

The present invention relates to a data processing system and method and, more particularly, to a system and method for performing error-checking.

BACKGROUND TO THE INVENTION

Cyclic Redundancy Check (CRC) is a term used to describe a family or range of error-checking codes that are used in data communication systems. CRC is based on finite field polynomial arithmetic. Some common Cyclic Redundancy Check standards are CRC-8, CRC-12, CRC-16, CRC-32, and CRC-CCIT.

CRC can be performed in serial or parallel modes. In parallel mode, the width of input data to a parallel CRC module is determined by a width, k, of the data bus. A generator polynomial function is used to compute the CRC output from two inputs. Typically, these two inputs are an input data word, data-in, and an initial value, init. The choice of generator polynomial can be varied according to desired performance and environment. It is known in the art that certain polynomials are more effective than others. At the start of the entire CRC process, the initial value is given as start value, but in subsequent CRC calculations it assumes a value derived from a previous CRC calculation.

There are at least two possible general CRC procedures that might be applied when preparing to transmit data. The first possible procedure passes all original data to be transmitted through the CRC module to generate a final output CRC value of data width m. The output CRC value is appended to the end of the original input data and the entire contents, that is, original data and output CRC value, are transmitted to a receiver. The receiver splits the received data into received input data words and received output CRC value. The receiver has a CRC module that performs the same CRC calculations on the received input data. If the received input data has been transmitted without any errors, then the CRC value, of data width m, calculated by the receiving CRC module will match the CRC value that was appended to the end of the original data. The absence of such a match provides a basis for performing error detection and correction.

A second possible CRC procedure appends a number, m, of zero bits to the end of the original data to be transmitted to produce extended data. The number, m, is governed by the number of bits of the CRC output value. This extended data is passed through the CRC module to produce an m bit CRC output value. The CRC output value replaces the appended m zero bits at the end of the data which produces revised extended data. The revised extended data is transmitted to a receiver. The entire length of the received data is fed into the CRC module of the receiver. The receiver CRC module performs the same CRC calculations using all of the received data. The receiving CRC module will give an output CRC value of zero if the transmission has been error free.

FIG. 1 shows schematically a CRC device or method 100 comprising a basic parallel CRC module 105, having an m-bit wide CRC initialisation value input 110, a k-bit wide data input 115, and an m-bit wide CRC output 120. An overall CRC calculation, for a data stream comprising more than k bits, is produced by dividing the data stream into a number of k-bit wide input data words and calculating a partial CRC result for a given input data word presented at the k-bit wide data input 115 and passing the partial CRC back to be used as the initial CRC value for the next partial CRC calculation using the next k-bit wide input word of the data stream. For example, the CRC module might use a 32-bit initial value and 128 bits of input data (k bits of data) to produce a 32-bit CRC output value 120. The transmitted packet would comprise a number of data bits followed by a number of CRC bits in the form of a Frame Check Sequence, FCS.

It can be appreciated that if the data stream does not contain an integer multiple of k-bit words, the final few bits of that data stream will not represent a complete data word suitable for processing by the parallel CRC module.

The accurate calculation of the final partial CRC on this final data word is required to support error free transmission of data. A problem can thus occur when the last data word is incomplete, that is, the number of valid data bits, n, of the data stream is less than the k bits of the data word used by the CRC module.

There are two general methods in the prior art for using parallel CRC's to accommodate such a final word having less than an anticipated number of bits. These two methods will be explained below with reference to FIGS. 2 and 3 respectively. Both are given as specific examples using k=128 bit data words and m=32 bit CRC modules to produce 32-bit CRC outputs. Both methods are given with an assumption that the data is transmitted most significant bit, msb, first. Thus, the data [127:120] is the first byte of data of a 128-bit data word or data stream. The last word of data in each solution is accompanied by a mod 230 signal which signifies how many of the data bits in the last data word are valid.

FIG. 2 shows a first parallel CRC system 200. It uses a number of CRC modules 205, 210, 215, 220 of different, incrementing, data widths to calculate the possible CRC results for a given data word. The results are fed into a multiplexer 225 along with a mod signal 230 that provides information on the number of valid data bits in the final word. The mod signal 230 allows the multiplexer 225 to select the appropriate output of the CRCs 205 to 220. As mentioned above, the mod signal 230 provides and indication of the number of valid data bits in a current word for which a CRC value is being calculated. For example, processing a data stream of 136 bits would use the 128-bit CRC module 220 to produce a first or partial CRC output and the 8-bit CRC module to produce a second CRC output. The first and second partial results are used to calculate the overall CRC output 235 for the 136-bit data stream. This approach is a fast method of accommodating variable length data streams. However, the design is large and, hence, area and power inefficient when implemented in silicon, that is, in hardware.

FIG. 3 shows a second parallel CRC system 300. It is based on an incremental process. A number, m, of 8-bit CRC modules 305, 310, 315, 320 are arranged in series such that each CRC passes a partial CRC result 325*a*, 325*b*, 325*c* to the next CRC in the sequence until the final, or maximum, CRC result 330 is calculated. Assuming that a 128-bit data word is to be processed, the first CRC module 305 takes the first 8 bits 335 of the data word, performs the CRC calculation, then feeds the partial CRC result 325*a* obtained to the next CRC module 310. The next CRC module 310 uses the partial CRC result 325*a* together with the next 8 bits 340 of the 128-bit data stream to produce a second partial CRC result 325*b* and so on until the final 8 bits 350 of the data stream are processed by the final CRC module 320 to produce a final or overall CRC result 330. The partial CRC results 325a, 325b, 325c and final CRC result 330 are fed into, or selected by, a multiplexer 225 that uses a mod signal 230 to select the correct CRC partial or final result to produce an appropriate CRC output 235 according to the length of the input data word being processed. It will be appreciated that variable length data can be accommodated using this design, providing the data length is an integer multiple of the number of bits processed by CRCs 305 to 320. This approach uses less area than the first but is slower because of the serial nature by which the CRC partial results are passed along the chain of CRC modules. Also, a further disadvantage is that the data width of each cascaded CRC module has to be chosen so as to anticipate or accommodate the number of valid data bits, n.

Prior art CRC calculations have been performed using either or a combination of the above two solutions. They use CRC calculations over a range of data widths and have a multiplexer with a mod signal to determine which CRC result is the correct one for the number of valid data bits within a given word. Multiple calculations are required and many CRC modules are required, along with a multiplexer, for performing and selecting the appropriate CRC result. It is apparent from the foregoing that the determination of the CRC output for variable length data or the last data word of a data stream is inefficient in terms of both area, time and power consumption and the number of valid bits in the last word has to be designed into the circuit and is generally inflexible.

It is an object of embodiments of the present invention, at least, to mitigate some of the problems of the prior art.

SUMMARY OF INVENTION

Accordingly, a first aspect of embodiments of the present invention provides a data processing method for generating at least one error checking code; the method comprising the steps of creating a modified input data word, comprising (k+m) bits, using an input data word, having n-bits, and at least a previously calculated at least one error checking code, comprising m-bits; calculating an intermediate m-bit error checking code using a first selected portion (k msbits of (k+m)-bit word) of the modified input data word and calculating the at least one error checking code by combining the intermediate m-bit error checking code and a second selected portion (m lsbits of (k+m)-bit word) of the modified input data word to produce the at least one error checking code.

Embodiments of the present invention can be applied to any existing method by which CRC calculations are performed to accommodate a variable number of data bits, especially if the number of data bits is not an integer multiple of the number of data bits of an available CRC module.

It will be appreciated that within the context of the embodiments of the present invention, the phrase "error-checking" comprises at least one of error detection and error correction and, preferably, both error detection and error correction. Similarly, error-checking codes are used to give effect to at least one of error detection and error correction and, preferably, both.

Preferred embodiments provide a method in which the step of creating comprises the step of deriving the (m+n−1)th to the mth bits of the modified input data word from at least one of the input data word and at least part of the previously calculated at least one error checking code.

Preferably, the step of creating comprises the step of deriving the (m+n−1)th to the mth bits of the modified input data word from at least one of the input data word and the whole of the previously calculated at least one error checking code.

Embodiments provide a method in which the step of creating comprises the step of deriving the m least significant bits of the modified input data word from at least one of m bits having a predetermined value and the previously calculated at least one error checking code.

Preferred embodiments are provided in which the step of deriving comprises the step of setting at least the n least significant bits of the modified data word to the predetermined value.

Preferably, embodiments provide a method in which the step of deriving comprises the step of deriving the (m−n) most significant bits of the m least significant bits of the modified input data word from the previously calculated at least one error checking code.

Preferred embodiments provide a method in which the step of deriving comprises the step of setting all of the m least significant bits of the modified input data word to the predetermined value.

Preferably, embodiments provide a method in which the step of calculating the at least one error checking code by combining the intermediate m-bit error checking code and a second selected portion (m lsbits of (k+m)-bit word) of the modified input data word to produce the at least one error checking code comprises the step of performing a finite field arithmetic operation using the intermediate m-bit error checking code and the second selected portion (m lsbits of (k+m)-bit word) of the modified input data word to produce the at least one error checking code.

Preferably, the finite field arithmetic operation comprises at least one of GF(p) addition or multiplication. Preferably, the GF(p) addition or multiplication is performed over a GF(2) field.

A second aspect of embodiments of the present invention provides a data processing system for generating at least one error checking code; the system comprising means to create a modified input data word, comprising (k+m) bits, using an input data word, having n-bits, and at least a previously calculated at least one error checking code, comprising m-bits; means to calculate an intermediate m-bit error checking code using a first selected portion (k msbits of (k+m)-bit word) of the modified input data word and means to calculate the at least one error checking code by combining the intermediate m-bit error checking code and a second selected portion (m lsbits of (k+m)-bit word) of the modified input data word to produce the at least one error checking code.

Preferably, there is provided a system in which the means to create comprises means to derive the (m+n−1)th to the mth bits of the modified input data word from at least one of the input data word and at least part of the previously calculated at least one error checking code.

Preferred embodiments provide a system in which the means to create comprises means to derive the (m+n−1)th to the mth bits of the modified input data word from at least one of the input data word and the whole of the previously calculated at least one error checking code.

Embodiments provide a system in which the means to create comprises means to derive the m least significant bits of the modified input data word from at least one of m bits, having a predetermined value, and the previously calculated at least one error checking code.

Preferably, there is provided a system in which the means to derive comprises means to set at least the n least significant bits of the modified data word to the predetermined value.

Preferred embodiments provide a system in which the means to derive comprises means to derive the (m−n) most significant bits of the m least significant bits of the modified input data word from the previously calculated at least one error checking code.

Embodiments preferably provide a system in which the means to derive comprises means to set all of the m least significant bits of the modified input data word to the predetermined value.

Preferred embodiments provide a system in which the means to calculate the at least one error checking code by combining the intermediate m-bit error checking code and a second selected portion (m lsbits of (k+m)-bit word) of the modified input data word to produce the at least one error checking code comprises means to perform a finite field arithmetic operation using the intermediate m-bit error checking code and the second selected portion (m lsbits of (k+m)-bit word) of the modified input data word to produce the at least one error checking code.

Preferably, embodiments provide a system in which the finite field arithmetic operation comprises at least one of GF addition or multiplication.

It will be appreciated that embodiments of the present invention can be realised using software designed to run on a processor such as, for example, a DSP. Suitably, a third aspect of embodiments of the present invention provides a computer program for generating at least one error checking code; the computer program comprising executable code to create a modified input data word, comprising (k+m) bits, using an input data word, having n-bits, and at least a previously calculated at least one error checking code, comprising m-bits; executable code to calculate an intermediate m-bit error checking code using a first selected portion (k msbits of (k+m)-bit word) of the modified input data word and executable code to calculate the at least one error checking code by combining the intermediate m-bit error checking code and a second selected portion (m lsbits of (k+m)-bit word) of the modified input data word to produce the at least one error checking code.

BRIEF DESCRIPTION OF THE DRAWINGS

Embodiments of the present invention will now be described, by way of example only, with reference to the accompanying drawings in which.

DESCRIPTION OF THE PREFERRED EMBODIMENTS

Figure 1:
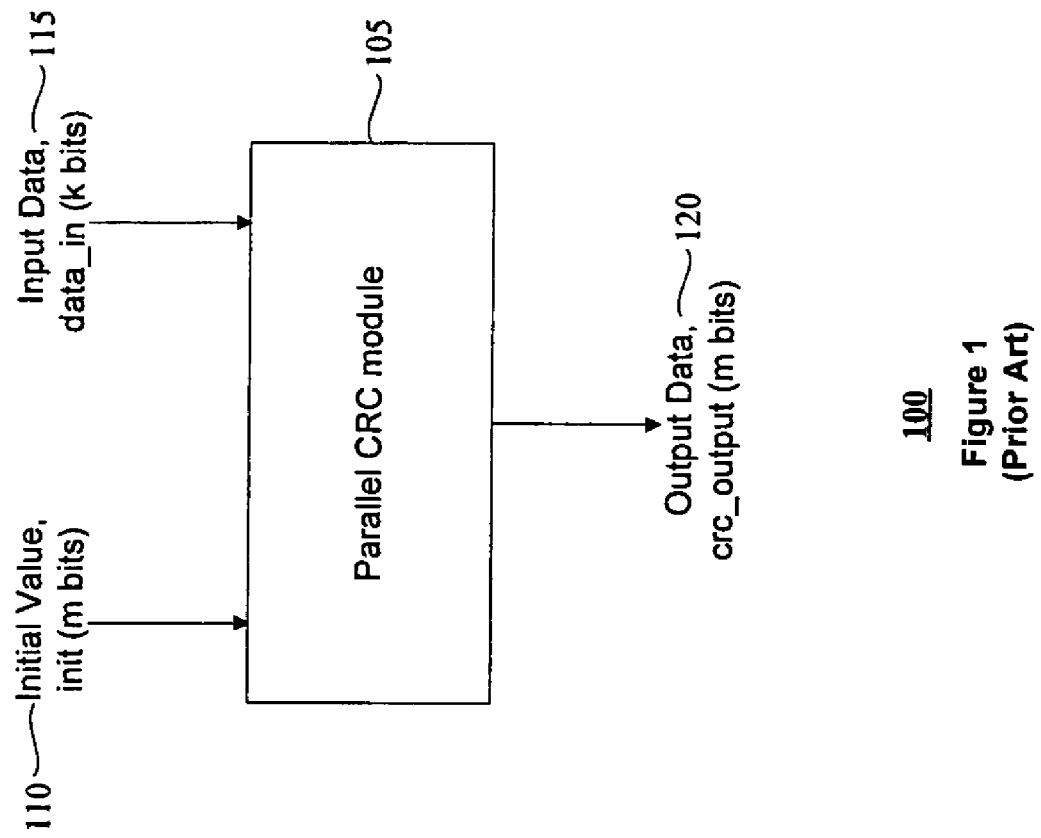
FIG. 1 shows a basic parallel CRC module.
Figure 2:
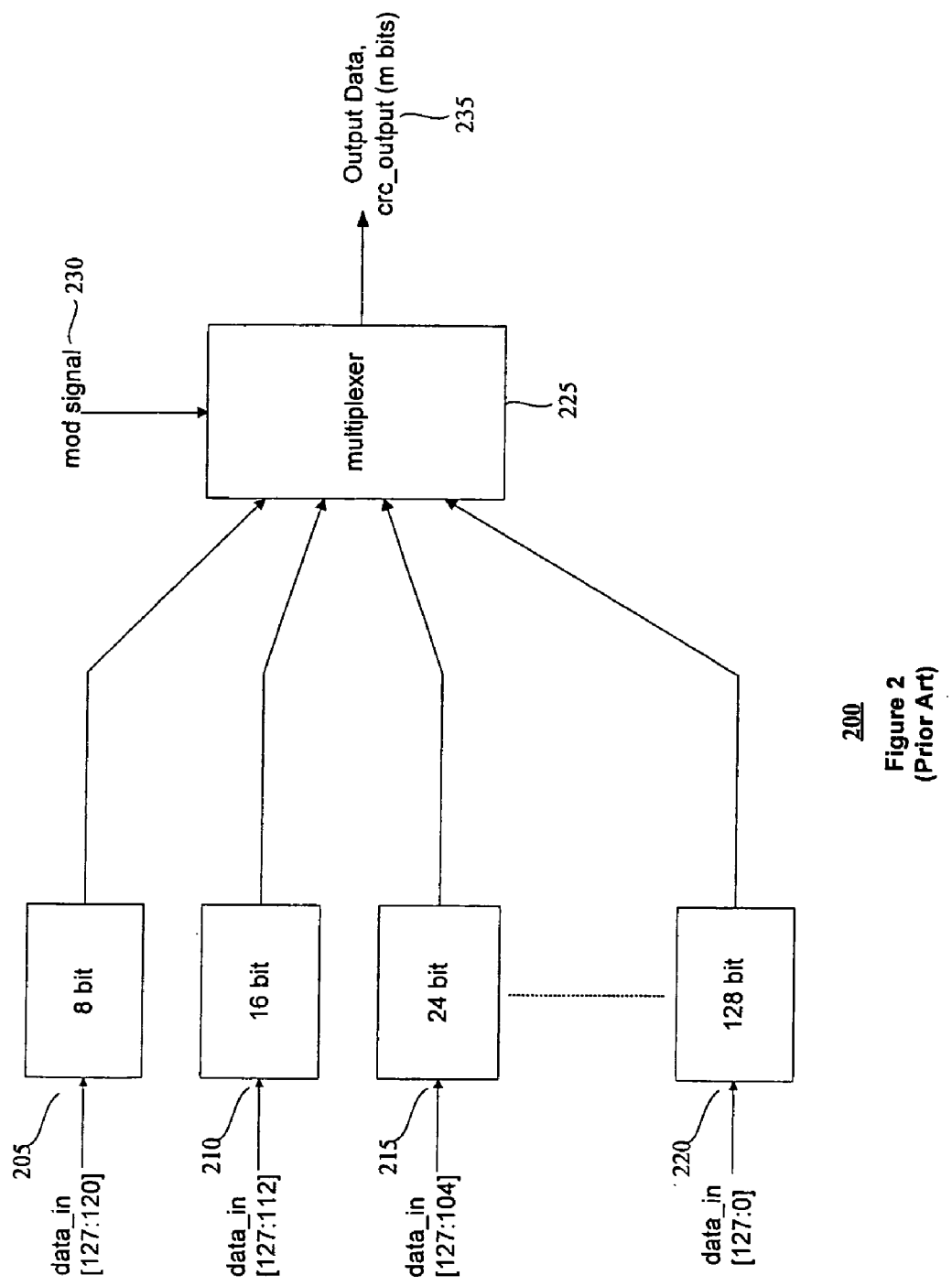
FIG. 2 shows a prior art system for performing CRC calculations.
Figure 3:
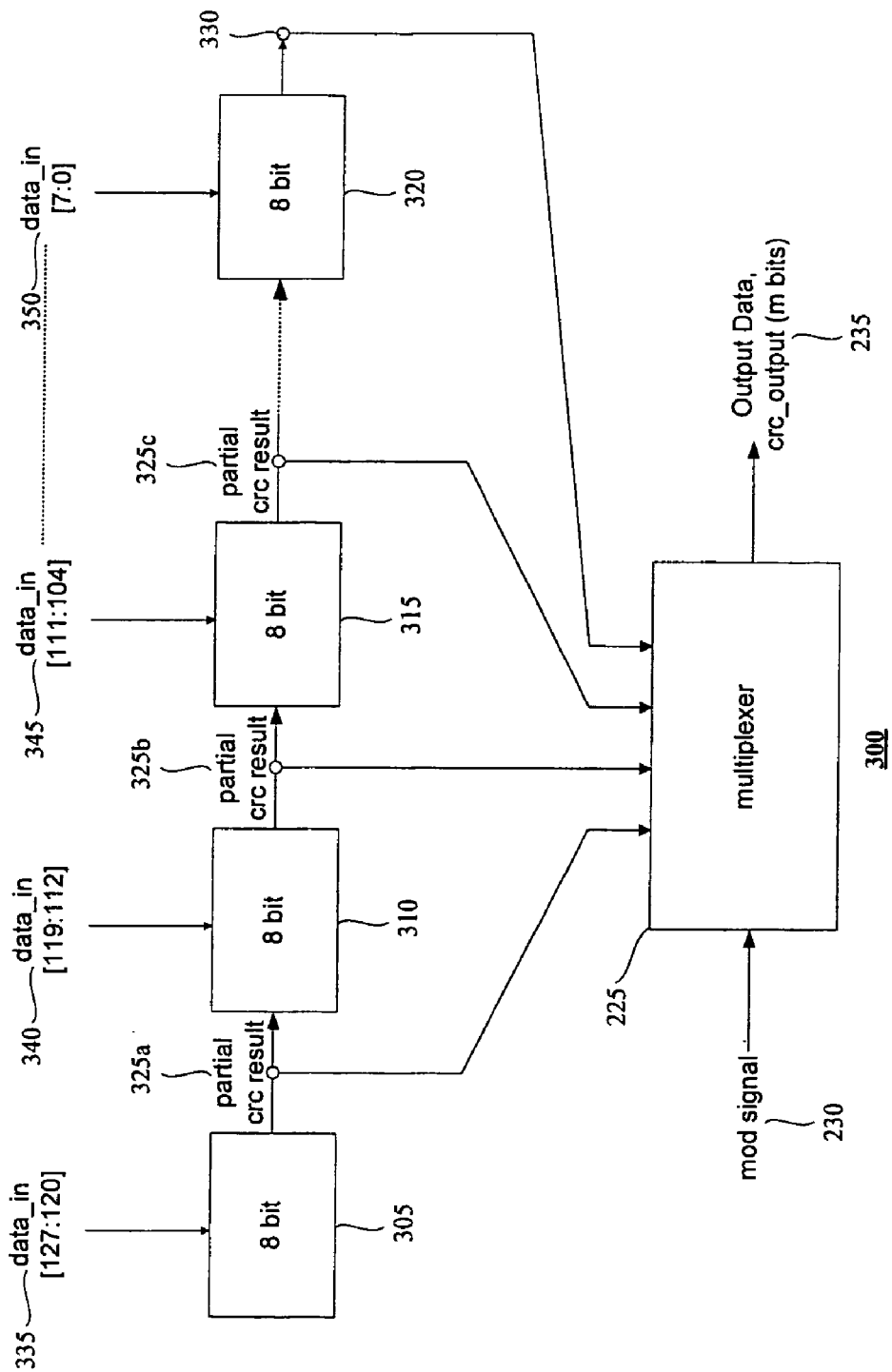
FIG. 3 shows a second prior art system for performing CRC calculations.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The present invention may be embodied as systems, methods, and/or computer program products. Accordingly, the present invention may be embodied in hardware and/or in software (including firmware, resident software, microcode, etc.). Furthermore, the present invention may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Figure 4:
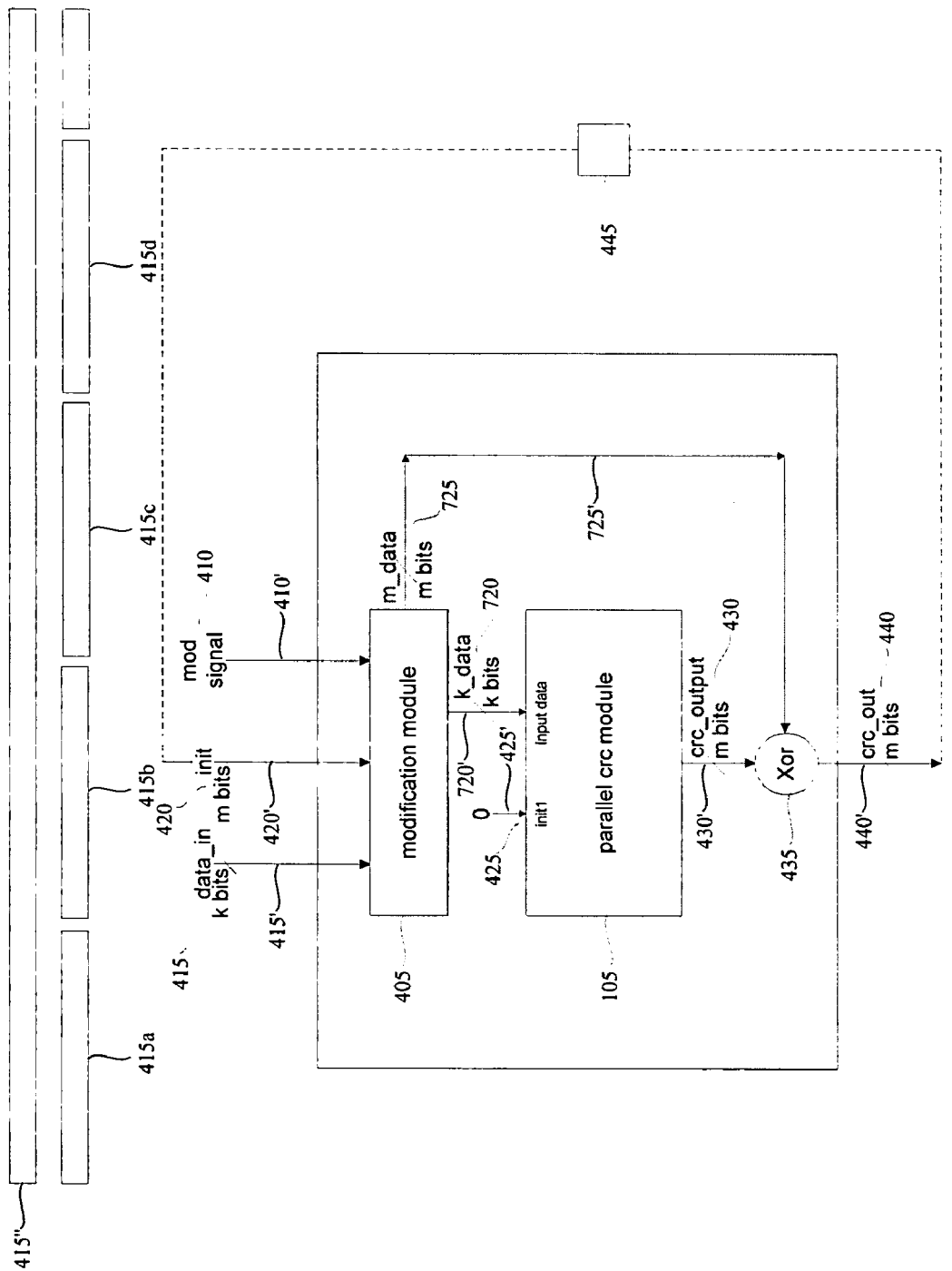
FIG. 4 shows a block diagram of the variable data width parallel CRC according to a first embodiment.

FIG. 4 shows a variable data length CRC module 400 comprising a modification module 405, a parallel CRC module 105, for producing an m-bit wide CRC output, and a finite field arithmetic element for performing Galois Field arithmetic, GF(p), preferably in the form of an exor gate. The CRC module might be used to calculate error-checking codes for messages for exchange between transmission and reception portions of a communication system. The modification module comprises three inputs; namely, a modification signal input 410' for receiving a modification signal 410, a k-bit data word input 415' for receiving an input data word 415, having n valid data bits, and an initialisation value input 420' for receiving an initialisation value 420, having m bits. The modification module 405 is arranged to perform pre-processing of the input data words 415, presented at the data word input 415', for which respective CRC values are required. The modification signal input 410' receives the modification signal 410, which provides an indication of how many bits of the input data word 415 are valid. The input data word 415 might be one data word of a number of data words 415a to 415d forming part of a data stream 415" for which an overall CRC value is required.

The modification signal 410 can take values in the range of zero to k inclusive, where k corresponds to the width of the input data word 410, or, more accurately, the width of the data word input 415'. The initialisation value input 420' is used to receive an initialisation value 420 for the CRC. For example, if the CRC-32 standard is to be complied with, the initialisation value might be 0xFFFFFFFF. Once the CRC process is running, subsequent initialisation values are derived from the CRC value 440 produced at the output 440' of the CRC module 400 for each input data word.

The modification module 405 comprises two outputs; namely, a modified data word 720, carried by a corresponding modified data word output bus 720', and modification data 725, carried by a corresponding modification data bus 725'. The modified data word output 720' forwards the k-bit modified input data word 720 for processing by the parallel CRC module 105.

The modification data output 725' carries the modification data 725 to the exor gate 435, where it is combined by the output 430 of the parallel CRC module 105. The output 430 of the parallel CRC module 105 is carried by a corresponding CRC output bus 430'. The combination of the modification data 725 and the CRC output 430 of the parallel CRC module 105 is used to produce the overall CRC output 440 via a corresponding bus 440'. The parallel CRC module 105 also comprises an initialisation input 425', which is always initialised to zero 425.

The operation of the CRC module 400 will now be described.

If an input data word 415 contains only valid data bits, that is, n=k, then the modification signal 410 remains at k or zero. In preferred embodiments, the modification signal, in such circumstances, remains at zero. The modification module 405 is arranged to produce a (k+m)-bit word. In general, the most significant k bits of the (k+m)-bit word are derived from the input data word with an appropriate number of leading zero bits to form a k-bit word. It will be appreciated that in the case where n=k, no such leading zero bits will be prefixed to the input data word 415. To the end of the most significant k bits is appended m zero bits to form the least significant m bits of the (k+m)-bit word. The m bit initialisation value 420 is combined with the (k+m)-bit word using a finite field arithmetic operation. In preferred embodiments, the finite field operation is GF(2) addition or multiplication, which is preferably implemented using an XOR gate. In preferred embodiments, the combination is performed by aligning the msb bit of the initialisation value 420 with the msb of the input data word 415 and performing an exclusive-or operation between the initialisation value 420 and the (k+m)-bit word using that alignment. It will be appreciated that in the case where n=k, the msb of the k or n-bit input data word 415 will be in the msb position of the (k+m)-bit word. The first k bits of the (k+m)-bit word, that is, the modified input data word 720, are forwarded from the modification module 405 to the parallel CRC module 105 via the bus 720', where they are subjected to a CRC process in the usual manner to produce an m-bit output 430 via the parallel CRC bus 430'. The m least significant bits of the (k+m)-bit word form the modification data 725 and are output via the modification data bus 725' to the arithmetic element 435, where the modification data 725 is combined with the output 430 of the parallel CRC module 105 to produce an overall CRC value for n or k-bit input data word 415. This process is repeated for each input data word for which n=k.

However, if the input data word 415 contains n<k valid data bits, then the modification signal 410 has a non-zero value which defines the number, n, of valid data bits within the input data word 415. It will be appreciated that such an input data word might occur if the data stream 415" to be transmitted comprises a number of bits that is not an integer multiple of k. In such circumstances, the modification signal might take values in the range of 1 to (k−1) inclusive. Again, the (k+m)-bit word is formed such that the n bits of the input data form for the least significant bits of a k-bit word, with the remaining, leading, (k−n) bits being set to zero, and m zeros are appended to such a k-bit word to form the (k+m)-bit word. Having formed the (k+m)-bit word comprising (k−n) zeros, followed by the n-bit input data word and the m appended zeros, the initialisation value 420 is ex-or'ed with the (k+m)-bit word such that the msb of the initialisation value is aligned with the msb bit of the n-bit input data word. Therefore, if n≧m, the m bits of the initialisation value 420 will be combined with the m most significant bits of the input data word 415. However, if n<m, it will be appreciated that the first n bits of the initialisation value 420 will be combined with the n bits of the input data word 415 and the remaining (m−n) bits of the initialisation value are combined with the first (m−n) bits of the m appended zeros. The first k-bits of the (k+m)-bit word, representing the modified input data word 720, are forwarded, via the bus 720', to the parallel CRC module 105 for use in producing the parallel CRC output 430 via the corresponding bus 430'. The modification data 726, which may comprise data derived from a portion of the initialisation value 420, according to whether or not n≧m or n<m, is forwarded to the exor gate 435 where it is combined with the output 430 of the parallel CRC module 105.

Figure 5:
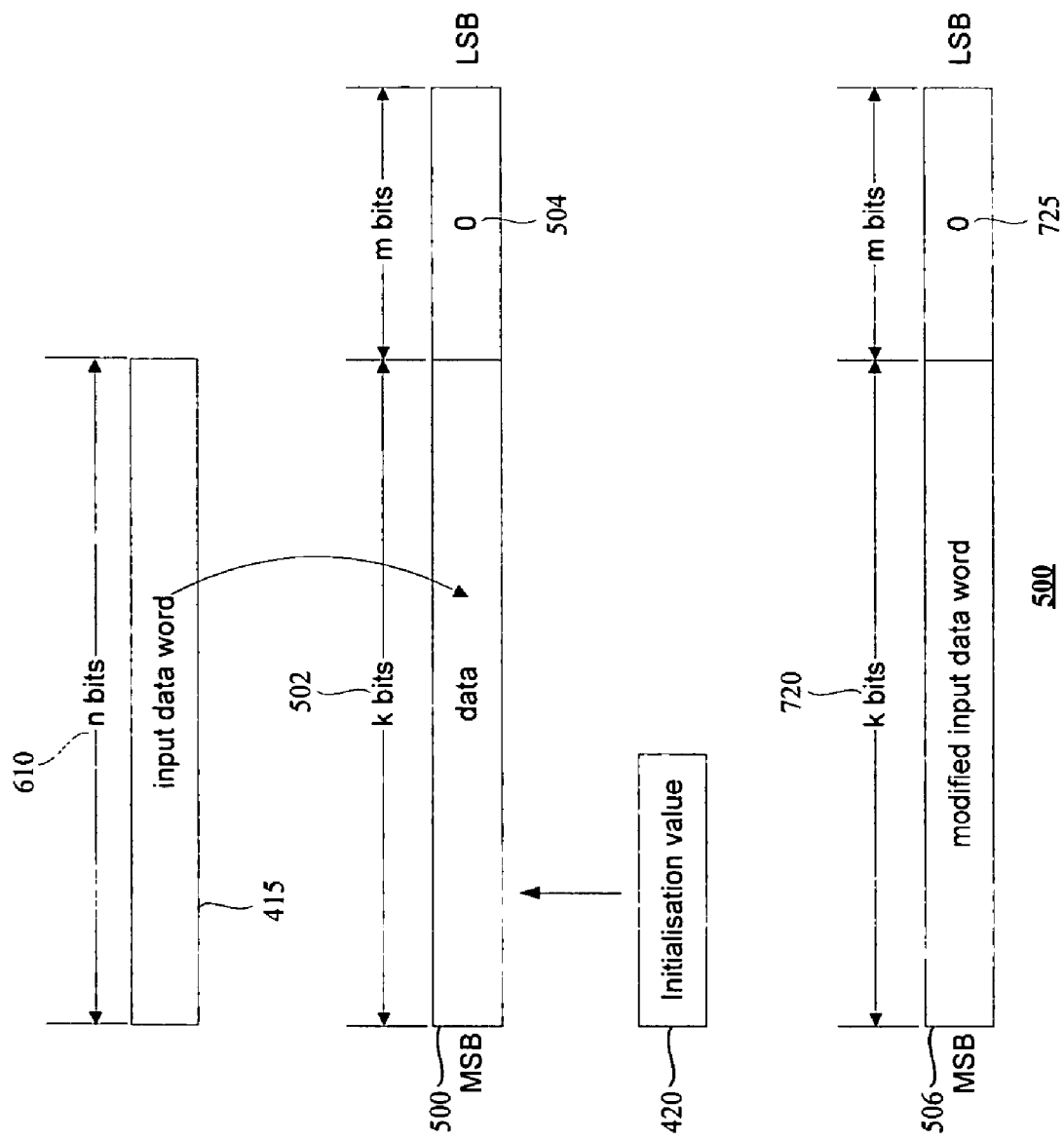
FIG. 5 shows a first process for modification of an input data word.

FIG. 5 illustrates the above processing for the case where n=k, that is, the number of valid data bits 610 of an input data word equals the width of the input data word bus 415' of the CRC module 400. It can be seen that the (k+m)-bit word 500 comprises k or n bits 502 derived from the data input word 415 in the k most significant bit positions and also has m zeros 504 appended. The initialisation value 420 is combined with the (k+m)-bit word using an exclusive-or operation such that there is bit alignment between the most significant bits of the n-bit input data word 415 and the initialisation value 420 to produce a modified (k+m)-bit word 506. The (k+m)-bit word 506 comprises the modified input data word 720 and the m zeros; the latter forming the modification data 725.

Figure 6:
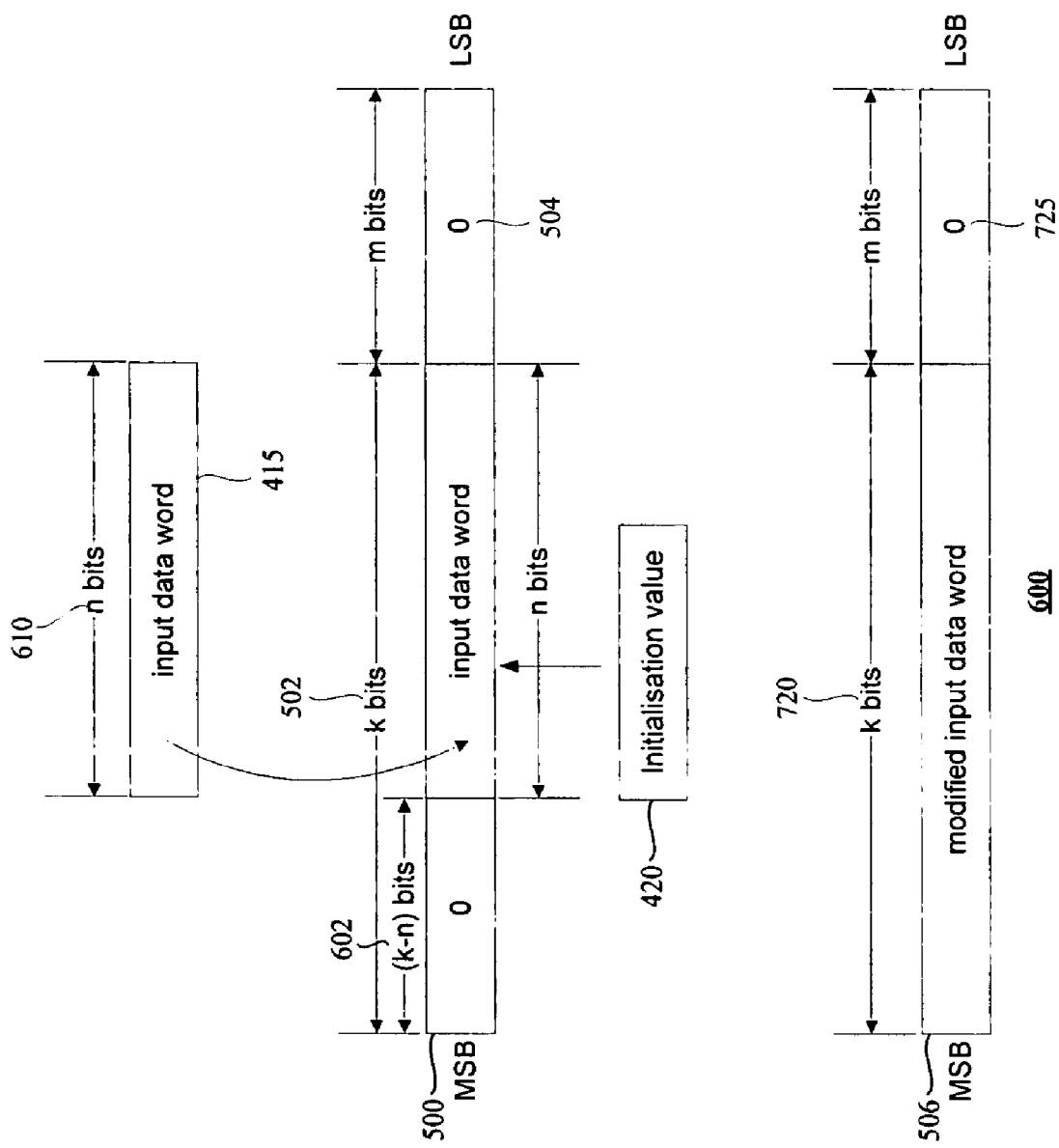
FIG. 6 shows a second process for modification of an input data word.

FIG. 6 shows the processing 600 undertaken by the modification module 405 when the number 610 of bits, n, of an input data word is less thank but n≧m. It can be seen that the (k+m)-bit word 500 comprises n bits 502, derived from the data input word 415, in the n least significant bit positions of the first or most significant bit positions of the (k+m)-bit word. The leading (k−n) bit positions are padded with zeros 602. The (k+m)-bit word also comprises m appended zeros 504. The initialisation value 420 is combined with the (k+m)-bit word using an exclusive-or operation such that there is bit alignment between the most significant bits of the n-bit input data word 415 and the initialisation value 420 to produce a modified (k+m)-bit word 506. The (k+m)-bit word 506 comprises the modified input data word 720 and the m zeros; the latter forming the modification data 725.

Figure 7:
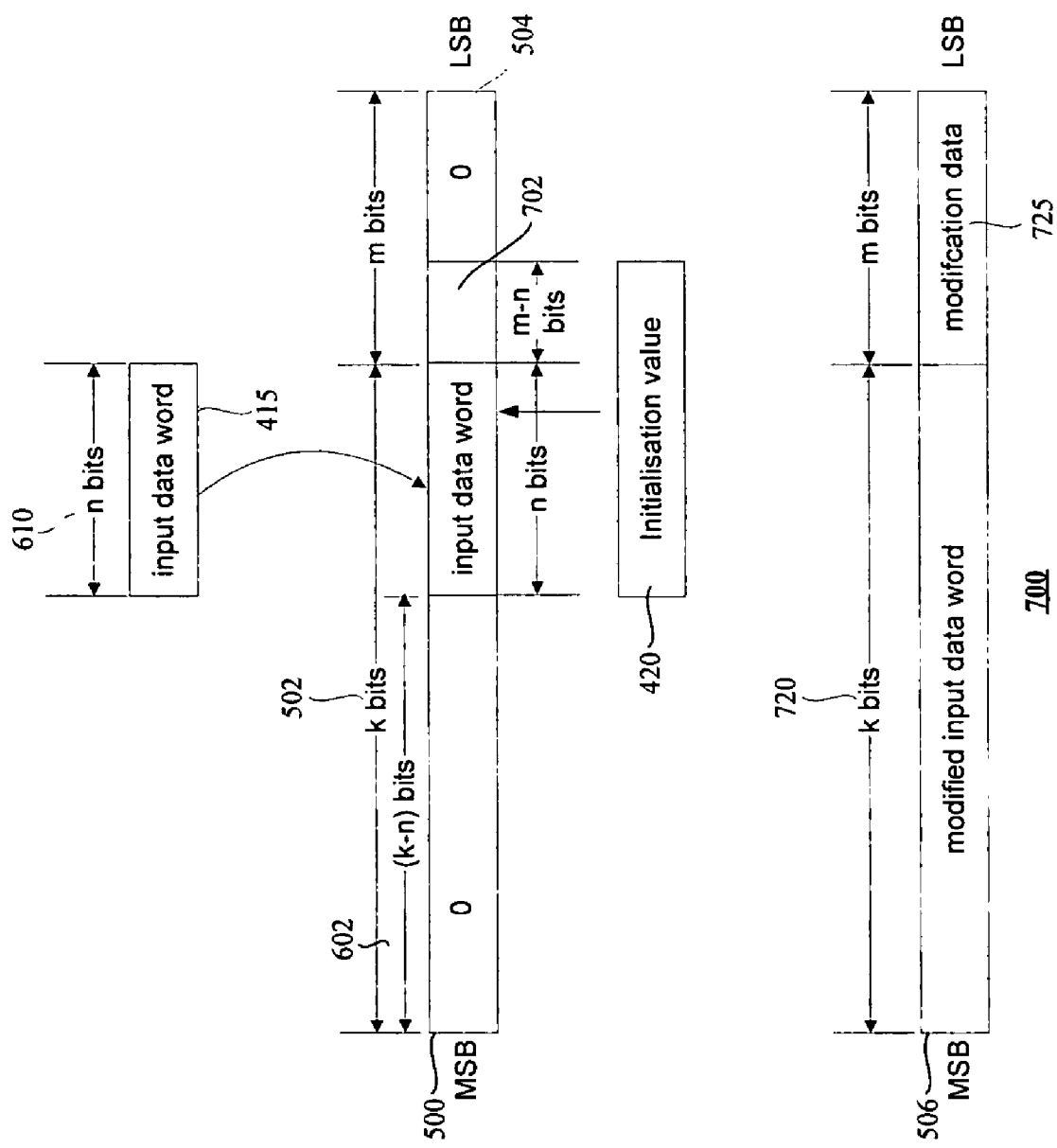
FIG. 7 shows a third process for modification of an input data word.

Referring to FIG. 7 there is shown the processing 700 undertaken by the modification module 405 when the number 610 of bits, n, of an input data word is less than k and n<m. It can be seen that the (k+m)-bit word 500 comprises n bits 502 derived from the data input word 415 in the n least significant bit positions of the k most significant bit positions of the (k+m)-bit word. The leading (k−n) bit positions are padded with zeros 602. The initialisation value 420 is combined with the (k+m)-bit word using an exclusive-or operation such that there is bit alignment between the most significant bits of the n-bit input data word 415 and the initialisation value 420 to produce a modified (k+m)-bit word 506. It will be appreciated that since n<m the combination of the (k+m)-bit word and the initialisation value 420 also modifies the first (m−n) most significant bits 702 of the m least significant bits of the (k+m)-bit word. The remaining n bits of the m least significant bits of the (k+m)-bit word are padded with zeros 504. Therefore, the (k+m)-bit word 506 comprises the modified input data word 720 and m-bit modification data 725 having some data derived from the initialisation value and n appended zeros.

The parallel CRC module 105 can be implemented in a number of ways. For example, the parallel CRC module might be initialised to zero and all of the (k+m) bits might be processed by the CRC module 105 as usual. Alternatively, the parallel CRC module 105 might be initialised using zeros and k-bits of the (k+m)-bit word might be processed by the CRC module 105 as usual with the CRC result being combined, preferably using an xor operation, with the remaining m bits of the (k+m)-bit word.

In other embodiments, the initialisation value used for the parallel CRC module 105 might be derived from the modified input data word itself. For example, the first m bits of the k-bit or (k+m) bit modified input data word might be used to initialise the parallel CRC module 105, with the remaining k bits being processed as usual.

Although the above embodiments have been described with reference to a CRC generator, it will be appreciated that the present invention is equally applicable to a CRC checker.

It will be appreciated that in cases where the parallel CRC module 105 is always initialised to zero, the initialisation in 425' will not be needed, that is, in the actual implementation, the initialisation input 425 is optional according to the actual realisation of embodiments of the present invention. Furthermore, it has been found that embodiments of the present invention are particularly suitable for hardware implementation.

The above embodiments have been described with reference to the modification signal providing an indication of the number of valid data bits being presented or to be processed. However, embodiments can equally well be realised in which the modification signal is used to derive or calculate the amount of valid data being presented or to be processed. For example, a value of the modification signal of "4" might represent "4" valid data bits in one embodiment or "4" valid data bytes in another embodiment. Therefore, in such embodiments, the modification signal might provide an indication of the number of valid data bits or bytes being presented for processing.

Furthermore, the above embodiments have been described with reference to combining the output of the parallel CRC module 105 with the modification data. The combination uses an exor gate. However, embodiments are not limited to such an arrangement. Embodiments can be realised in which the whole (k+m)-bit word of modified input data is fed into the parallel CRC module and processed to produce a respective output. In such an embodiment, the modification data would be processed by the parallel CRC module 105 itself rather than being added to the parallel CRC module result using the exor gate. Therefore, such an embodiment would use neither the exor date 435 nor the modification data bus 725'.

Although the above embodiment has been described with reference to processing and positioning data with reference to most significant bits and least significant bits for a given operation, embodiments can equally well be realised in which the processing and positioning of data is done with reference to least significant bits and most significant bits if the given operation/s is/are reversed. For example, FIG. 5 illustrates the most significant bit as being on the LHS of the diagram and the least significant bits as being towards the RHS of the diagram. However, this can be reversed. Such a reversal would also entail reversal of the initialisation value, that is, the msb's of the initialisation value would appear on the RHS and the lsb's of the initialisation value would appear on the LHS of the drawing.

Figure 8:
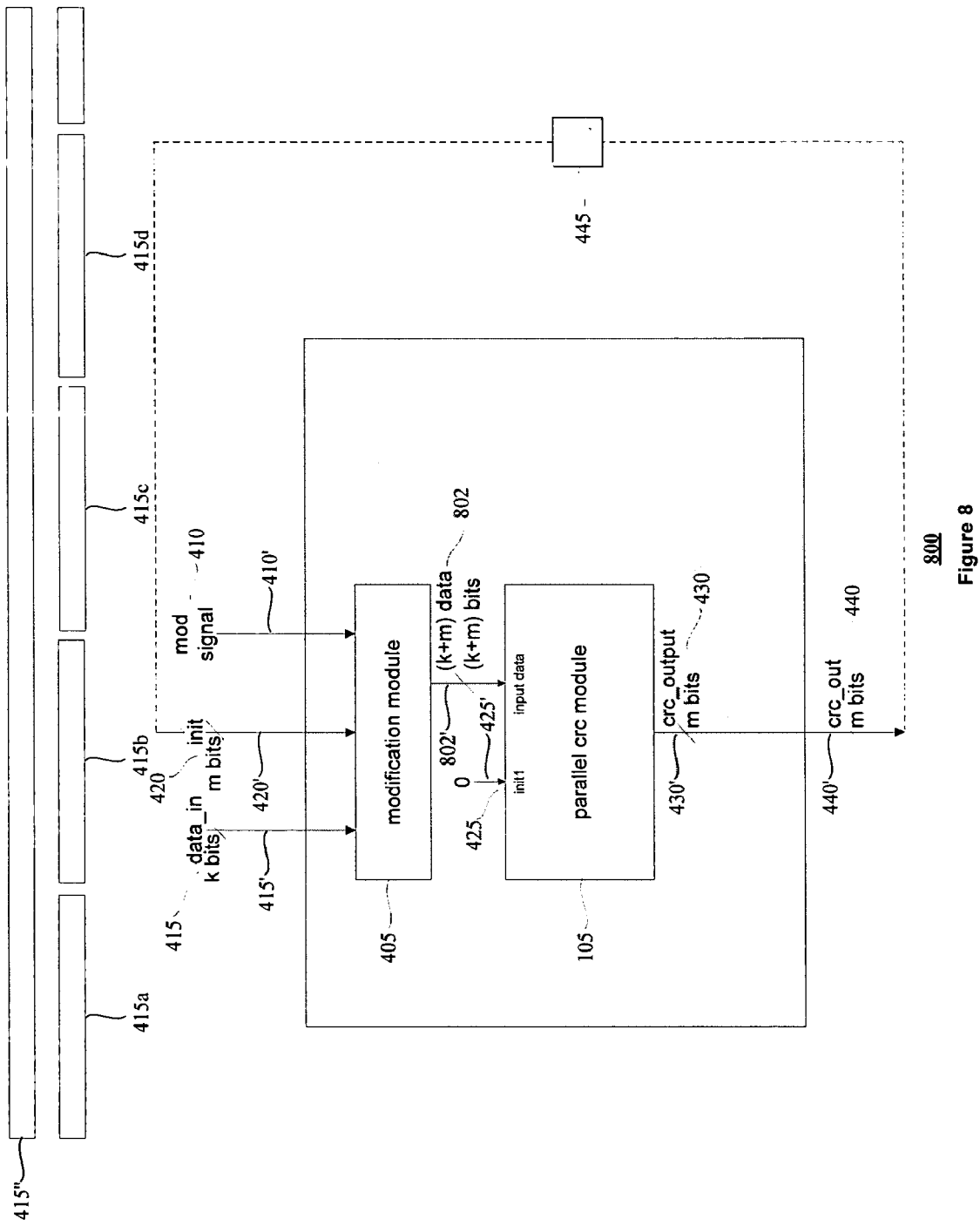
FIG. 8 shows a specific embodiment of the present invention.

FIG. 8 illustrates a further embodiment 800 of the present invention. As compared to the embodiment 400 shown in FIG. 4, the modification data 720 is not forwarded to an xor gate. The modification data 720 is instead forwarded to the parallel CRC modules as a (k+m)-bit word 802 via a (k+m)-bit wide bus 802'. Alternatively, the parallel CRC module 105 might be initialised using the first m bits of the (k+m)-bit word, with the remaining k-bits being processed as usual.

The parallel CRC module 105 might be implemented by combining the output of the parallel CRC with the modified data word using an exor gate and feeding the result back into the parallel CRC. Alternatively, the parallel CRC register might be loaded with the modified input data word or at least a portion thereof.

The reader's attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims, abstract and drawings) and/or all of the steps of any method or process so disclosed, may be combined in any combination, except combinations where at least some of such features and/or steps are mutually exclusive.

Each feature disclosed in this specification (including any accompanying claims, abstract and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

That which is claimed:

1. A method for generating at least one error checking code, comprising:

creating a modified input data word, comprising (k+m) bits, by combining an input data word, having n-bits, with at least a previously calculated at least one error checking code, comprising m-bits, where $n \leq k$; and calculating a first m-bit error checking code from at least a first selected portion of the modified input data word.

2. A method as claimed in claim 1, wherein creating the modified input data word comprises deriving the (m+n−1)th to the mth bits of the modified input data word from at least one of the input data word and at least part of the previously calculated at least one error checking code.

3. A method as claimed in claim 2, wherein creating the modified input data word comprises deriving the (m+n−1)th to the mth bits of the modified input data word from at least one of the input data word and the whole of the previously calculated at least one error checking code.

4. A method as claimed in claim 1, wherein creating the modified input data word comprises deriving the m least or most significant bits of the modified input data word from at least one of m bits, having a predetermined value, and the previously calculated at least one error checking code.

5. A method as claimed in claim 4, wherein deriving the m least or most significant bits comprises setting at least the n least or most significant bits of the modified data word to the predetermined value.

6. A method as claimed in claim 5, wherein deriving the m least or most significant bits comprises setting all of the m least or most significant bits of the modified input data word to the predetermined value.

7. A method as claimed in claim 4, wherein deriving the m least or most significant bits comprises deriving the (m−n) most or least significant bits of the m least or most significant bits of the modified input data word from the previously calculated at least one error checking code.

8. A method as claimed in claim 1, wherein the first m-bit error checking code is an intermediate m-bit error checking code, and the generating the at least one error checking code comprises performing a finite field arithmetic operation using the intermediate m-bit error checking code and a second selected portion of the modified input data word to generate the at least one error checking code.

9. A method as claimed in claim 8, wherein the finite field arithmetic operation comprises at least one of Galois Field (GF) addition or multiplication.

10. A method as claimed in claim 1, wherein the first m-bit error checking code is an intermediate m-bit error checking code, and the method further comprises generating the at least one error checking code by combining the intermediate m-bit error checking code and a second selected portion of the modified input data word.

11. A method as claimed in claim 1, further comprising calculating the first m-bit error checking code using a parallel CRC module that has one of a k-bit wide data input and a (k+m)-bit wide data input.

12. A method as claimed in claim 1, wherein creating a modified input data word comprises, if n<k, creating the modified input data word such that the (k−n) most significant bits comprise a predetermined value.

13. A method as claimed in claim 1, wherein creating a modified input data word comprises, if n<k, creating the modified input data word such that the (k−n) least significant bits comprise a predetermined value.

14. A method as claimed in claim 1, further comprising creating a first modified input data word, having (k+m) bits, by combining an input data word, having n bits, with an initialization value.

15. A system for generating at least one error checking code, comprising:
means for creating a modified input data word, comprising (k+m) bits, by combining an input data word, having n-bits, with at least a previously calculated at least one error checking code, comprising m-bits, where n≦k; and
means for calculating a first m-bit error checking code from at least a first selected portion of the modified input data word.

16. A system as claimed in claim 15, wherein the means for creating the modified input data word comprises means for deriving the (m+n−1)th to the mth bits of the modified input data word from at least one of the input data word and at least part of the previously calculated at least one error checking code.

17. A system as claimed in claim 16, wherein the means for creating the modified input data word comprises means for deriving the (m+n−1)th to the mth bits of the modified input data word from at least one of the input data word and the whole of the previously calculated at least one error checking code.

18. A system as claimed in claim 15, wherein the means for creating the modified input data word comprises means for deriving the m least or most significant bits of the modified input data word from at least one of m bits, having a predetermined value, and the previously calculated at least one error checking code.

19. A system as claimed in claim 18, wherein the means for deriving the m least or most significant bits comprises means for setting at least the n least or most significant bits of the modified data word to the predetermined value.

20. A system as claimed in claim 19, wherein the means for deriving the m least or most significant bits comprises means for setting all of the m least or most significant bits of the modified input data word to the predetermined value.

21. A system as claimed in claim 18, wherein the means for deriving the m least or most significant bits comprises means for deriving the (m−n) most or least significant bits of the m least or most significant bits of the modified input data word from the previously calculated at least one error checking code.

22. A system as claimed in claim 15, wherein the first m-bit error checking code is an intermediate m-bit error checking code, and the means for generating the at least one error checking code comprises means for performing a finite field arithmetic operation using the intermediate m-bit error checking code and a second selected portion of the modified input data word to generate the at least one error checking code.

23. A system as claimed in claim 22, wherein the finite field arithmetic operation comprises at least one of Galois Field (GF) addition or multiplication.

24. A system as claimed in claim 15, wherein the first m-bit error checking code is an intermediate m-bit error checking code, and the system further comprises means for generating the at least one error checking code by combining the intermediate m-bit error checking code and a second selected portion of the modified input data word.

25. A system as claimed in claim 15, further comprising means for calculating the first m-bit error checking code using a parallel CRC module that has one of a k-bit wide data input and a (k+m)-bit wide data input.

26. A system as claimed in claim 15, wherein the means for creating a modified input data word comprises, if n<k, means for creating the modified input data word such that the (k−n) most significant bits comprise a predetermined value.

27. A system as claimed in claim 15, wherein the means for creating a modified input data word comprises, if n<k, means for creating the modified input data word such that the (k−n) least significant bits comprise a predetermined value.

28. A system as claimed in claim 15, further comprising means for creating a first modified input data word, having (k+m) bits, by combining an input data word, having n bits, with an initialization value.

29. A computer program product for generating at least one error checking code, comprising:
- a computer readable storage medium having computer readable program code embodied therein, the computer readable program code comprising:
- computer readable program code configured to create a modified input data word, comprising (k+m) bits, by combining an input data word, having n-bits, with at least a previously calculated at least one error checking code, comprising m-bits. where n≦k; and
- computer readable program code configured to calculate a first m-bit error checking code from at least a first selected portion of the modified input data word.

30. A computer program product as claimed in claim 29, wherein the computer readable program code configured to create the modified input data word comprises computer readable program code configured to derive the (m+n−1)th to the mth bits of the modified input data word from at least one of the input data word and at least part of the previously calculated at least one error checking code.

31. A computer program product as claimed in claim 30, wherein the computer readable program code configured to create the modified input data word comprises computer readable program code configured to derive the (m+n−1)th to the mth bits of the modified input data word from at least one of the input data word and the whole of the previously calculated at least one error checking code.

32. A computer program product as claimed in claim 29, wherein the computer readable program code configured to create the modified input data word comprises computer readable program code configured to derive the m least or most significant bits of the modified input data word from at least one of m bits, having a predetermined value, and the previously calculated at least one error checking code.

33. A computer program product as claimed in claim 32, wherein the computer readable program code configured to derive the m least or most significant bits comprises computer readable program code configured to set at least the n least or most significant bits of the modified data word to the predetermined value.

34. A computer program product as claimed in claim 33, wherein the computer readable program code configured to derive the m least or most significant bits comprises computer readable program code configured to set all of the m least or most significant bits of the modified input data word to the predetermined value.

35. A computer program product as claimed in claim 32, wherein the computer readable program code configured to derive the m least or most significant bits comprises computer readable program code configured to derive the (m−n) most or least significant bits of the m least or most significant bits of the modified input data word from the previously calculated at least one error checking code.

36. A computer program product as claimed in claim 29, wherein the first m-bit error checking code is an intermediate m-bit error checking code, and the computer readable program code configured to generate the at least one error checking code comprises computer readable program code configured to perform a finite field arithmetic operation using the intermediate m-bit error checking code and a second selected portion of the modified input data word to generate the at least one error checking code.

37. A computer program product as claimed in claim 36, wherein the finite field arithmetic operation comprises at least one of Galois Field (GF) addition or multiplication.

38. A computer program product as claimed in claim 29, wherein the first m-bit error checking code is an intermediate m-bit error checking code, and the computer program product further comprises computer readable program code configured to generate the at least one error checking code by combining the intermediate m-bit error checking code and a second selected portion of the modified input data word.

39. A computer program product as claimed in claim 29, further comprising computer readable program code configured to calculate the first m-bit error checking code using a parallel CRC module that has one of a k-bit wide data input and a (k+m)-bit wide data input.

40. A computer program product as claimed in claim 29, wherein the computer readable program code configured to create a modified input data word comprises, if n<k, computer readable program code configured to create the modified input data word such that the (k−n) most significant bits comprise a predetermined value.

41. A computer program product as claimed in claim 29, wherein the computer readable program code configured to create a modified input data word comprises, if n<k, computer readable program code configured to create the modified input data word such that the (k−n) least significant bits comprise a predetermined value.

42. A computer program product as claimed in claim 29, further comprising computer readable program code configured to create a first modified input data word, having (k+m) bits, by combining an input data word, having n bits, with an initialization value.

* * * * *

UNITED STATES PATENT AND TRADEMARK OFFICE
CERTIFICATE OF CORRECTION

PATENT NO. : 7,168,024 B2 Page 1 of 1
APPLICATION NO. : 10/678625
DATED : January 23, 2007
INVENTOR(S) : Farnsworth It is certified that error appears in the above-identified patent and that said Letters Patent is hereby corrected as shown below:

On The Title Page,

Item [57]: ABSTRACT should read: --A method for generating at least one error checking code includes creating a modified input data word, including (k+m) bits, by combining an input data word, having n-bits, with at least a previously calculated at least one error checking code, including m-bits, where $n \leq k$, and calculating a first m-bit error checking code from at least a first selected portion of the modified input data word. --

Column 13,

Line 10: Should read: --code, comprising m-bits, where $n \leq k$, and --

Signed and Sealed this

Thirtieth Day of October, 2007

JON W. DUDAS
*Director of the United States Patent and Trademark Office*